United States Patent [19]
Bezama et al.

[11] Patent Number: 5,541,005
[45] Date of Patent: Jul. 30, 1996

[54] LARGE CERAMIC ARTICLE AND METHOD OF MANUFACTURING

[75] Inventors: Raschid J. Bezama, Mahopac; Jon A. Casey, LaGrange; Mario E. Ecker, Poughkeepsie; Shaji Farooq, Hopewell Junction; Irene S. Frantz, Leeds; Katherine G. Frase, Peekskill; David H. Gabriels, Cold Springs; Lester W. Herron, Hopewell Junction; John U. Knickerbocker, Hopewell Junction; Sarah H. Knickerbocker, Hopewell Junction; Govindarajan Natarajan, Pleasant Valley; John Thomson, Lake Carmel; Yee-Ming Ting, Cornwall; Sharon L. Tracy, LaGrangeville; Robert M. Troncillito, Marlboro; Vivek M. Sura, Hopewell Junction; Donald R. Wall, Wappingers Falls, all of N.Y.; Giai V. Yen, Seattle, Wash.

[73] Assignee: International Business Machines Corporation, Armonk, N.Y.

[21] Appl. No.: 438,825

[22] Filed: May 11, 1995

Related U.S. Application Data

[62] Division of Ser. No. 836,675, Feb. 18, 1992, Pat. No. 5,439,636.

[51] Int. Cl.⁶ ..................................... B22F 3/105
[52] U.S. Cl. .............. 428/551; 428/565; 428/44; 428/47; 428/49; 428/58; 264/61
[58] Field of Search .................. 428/546, 548, 428/551, 552, 565, 44, 47, 48, 49, 50, 51, 57, 58, 59, 33, 53, 54, 55, 56; 264/61

[56] References Cited

U.S. PATENT DOCUMENTS

| | | | |
|---|---|---|---|
| 3,023,492 | 3/1962 | Bristow | 29/195 |
| 3,107,756 | 10/1963 | Gallet | 189/36.5 |
| 3,235,428 | 2/1966 | Naymik | 156/89 |
| 3,335,048 | 8/1967 | Morain | 161/38 |
| 3,460,305 | 8/1969 | Long | 52/604 |
| 3,817,012 | 6/1974 | Wack et al. | 52/315 |
| 4,047,993 | 9/1977 | Bartelmuss | 156/89 |
| 4,164,442 | 8/1979 | Bartelmuss | 162/352 |
| 4,413,061 | 11/1988 | Kumar et al. | 501/7 |
| 4,420,352 | 12/1988 | Schroeder et al. | 156/89 |
| 4,567,704 | 2/1986 | Bernett et al. | 52/309.3 |
| 4,724,020 | 2/1988 | Ebata et al. | 156/82 |
| 4,767,479 | 8/1988 | Ferguson et al. | 156/89 |
| 4,781,775 | 11/1988 | Reed et al. | 156/89 |
| 4,928,870 | 5/1990 | Gatliquornik et al. | 228/107 |
| 4,952,454 | 8/1980 | Iwamoto et al. | 428/446 |
| 4,953,627 | 9/1990 | Ito et al. | 165/8 |
| 5,000,811 | 3/1991 | Campanelli | 156/264 |
| 5,045,142 | 9/1991 | Drake et al. | 156/278 |
| 5,069,745 | 12/1991 | Ohuchida et al. | 156/630 |
| 5,102,720 | 4/1992 | Raj | 421/209 |
| 5,139,594 | 8/1992 | Rabin | 156/89 |
| 5,250,130 | 10/1993 | Enloe et al. | 156/89 |

FOREIGN PATENT DOCUMENTS

| | | | |
|---|---|---|---|
| 154222 | 9/1985 | European Pat. Off. | 428/33 |
| 8101369 | 10/1982 | Netherlands | 428/54 |

*Primary Examiner*—Harvey E. Behrend
*Assistant Examiner*—Chrisman D. Carroll
*Attorney, Agent, or Firm*—Ira D. Blecker

[57] ABSTRACT

A large ceramic substrate article for electronic applications including at least one layer of sintered ceramic material, the layer including a plurality of greensheet segments of ceramic material joined edge to edge. Also disclosed is a method of fabricating a large ceramic greensheet article as well as a large ceramic substrate article.

19 Claims, 6 Drawing Sheets

LARGE CERAMIC ARTICLE AND METHOD OF MANUFACTURING

This is a divisional of U.S. patent application No. 07/836,675, filed Feb. 18, 1992, now U.S. Pat. No. 5,439,636.

The present invention relates to the field of co-fired, ceramic structures and, more particularly, to large ceramic structures for electronic applications which are made by the joining of smaller ceramic structures.

BACKGROUND OF THE INVENTION

Ceramic structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual ceramic layers formed prior to lamination, which, upon sintering, will become a sintered dense metal interconnection of metal-based conductor.

In general, conventional ceramic structures are formed from ceramic greensheets which are prepared by mixing a ceramic particulate, a thermoplastic polymer binder, plasticizers, and solvents. This composition is spread or cast into ceramic sheets or slips from which the solvents are subsequently volatilized to provide coherent and self-supporting flexible greensheets. After blanking, stacking and laminating, the green sheets are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Current ceramic structures for electronic applications range up to about 127 mm. which can hold about 121 silicon devices. Typically, several of these structures are linked together through hardwire interconnections to perform, for example, a computing function. Inherently, there are propagation delays associated with such an arrangement due to the distances between linked ceramic structures. The electrical performance of the arrangement can be improved by decreasing the distance between ceramic structures.

One solution is to fabricate larger structures of 300 mm or more to hold more silicon devices. The surface area of such a ceramic structure is roughly 4 times that of existing ceramic structures. Since more of the silicon devices will be on a single structure, the inherent propagation delays associated with the hardwire interconnections will be eliminated. It is expected that vastly improved electrical performance will result.

The difficulty arises, however, in fabricating such large ceramic structures. According to conventional tape casting technology, all that need be done is to "simply" scale up existing tooling and technology to arrive at a larger ceramic structure. The cost, however, for such an endeavor would be prohibitive.

The present inventors have proposed joining several smaller ceramic structures into a single large ceramic structure. Aside from the present invention being a lower cost alternative to simply scaling up existing tooling, the proposed invention is also advantageous in that smaller ceramic structures have better dimensional stability than larger ones, thereby indicating that large ceramic structures comprised of smaller, joined ceramic structures will have better dimensional stability than tape cast large ceramic structures. The finished size of such a large ceramic structure would be about 300 mm or more to meet the future demands of electrical performance. This solution is not without difficulty either as the challenge is to join smaller greensheet segments together while maintaining electrical continuity across the entire ceramic structure and to be able to sinter the large ceramic structure without cracking and distortion.

Thus far, no solutions in the prior art have been proposed which meet this challenge.

The following references are relevant to the joining of ceramic parts in general.

Schroeder et al. U.S. Pat. No. 4,420,352 discloses the joining of ceramic heat exchanger parts wherein the adjacent surfaces to be joined are locally heated by RF heating. Ebata et al. U.S. Pat. No. 4,724,020 discloses a similar process but wherein the local heating is by high voltage torches.

Ferguson et al. U.S. Pat. No. 4,767,479 discloses a method of bonding green (unfired) ceramic casting cores. The casting cores are made up of ceramic particles and a binder. The binder in the casting cores is softened by applying a solvent and then ceramic filler particles are added to at least one of the surfaces to be joined. Thereafter, the ceramic casting cores are assembled until the solvent has evaporated.

Gat-Liquornik et al. U.S. Pat. No. 4,928,870 discloses the joining of ceramic parts by placing a metal foil or wire between the surfaces to be joined and then subjecting the metal foil or wire to a high current for a short period of time.

Iwamoto et al. U.S. Pat. No. 4,952,454 discloses the joining of ceramic parts wherein a paste including metals and metal oxides is applied to the surfaces to be joined and then the assembly is heated to effect bonding.

Ito et al. U.S. Pat. No. 4,953,627 discloses the joining of ceramic heat exchanger parts wherein a bonding material, e.g. glass, is applied to the surfaces to be joined and then the assembly is fired to effect bonding.

It is, accordingly, an object of the present invention to form a large ceramic structure for electronic applications from smaller electronic structures.

It is another object of the invention to form the large ceramic structure in a way to maintain electrical continuity between the joined segments.

It is yet another object of the invention to have a method for fabricating such a large ceramic structure.

These and other objects of the invention will become more apparent after referring to the following description considered in conjunction with the accompanying drawings.

BRIEF SUMMARY OF THE INVENTION

One aspect of the invention relates to a method of fabricating a large ceramic greensheet article for electronic applications comprising the step of joining a plurality of greensheet segments, edge to edge, to form a larger greensheet.

A second aspect of the invention relates to a method of fabricating a large ceramic substrate article for electronic applications comprising the steps of:
  a. joining a plurality of greensheet segments, edge to edge, to form at least one larger greensheet; and
  b. sintering said at least one larger greensheet to form a large substrate.

A third aspect of the invention relates to a large ceramic greensheet article for electronic applications comprising a plurality of greensheet segments joined, edge to edge, to form a larger greensheet.

A final aspect of the invention relates to a large ceramic substrate article for electronic applications comprising at least one layer of sintered ceramic material, said layer comprising a plurality of greensheet segments of ceramic material joined edge to edge.

BRIEF DESCRIPTION OF THE DRAWINGS

FIG. 2A is a plan view of an alternative stacking arrangement of two large ceramic greensheets while

DETAILED DESCRIPTION OF THE INVENTION

Figure 1:
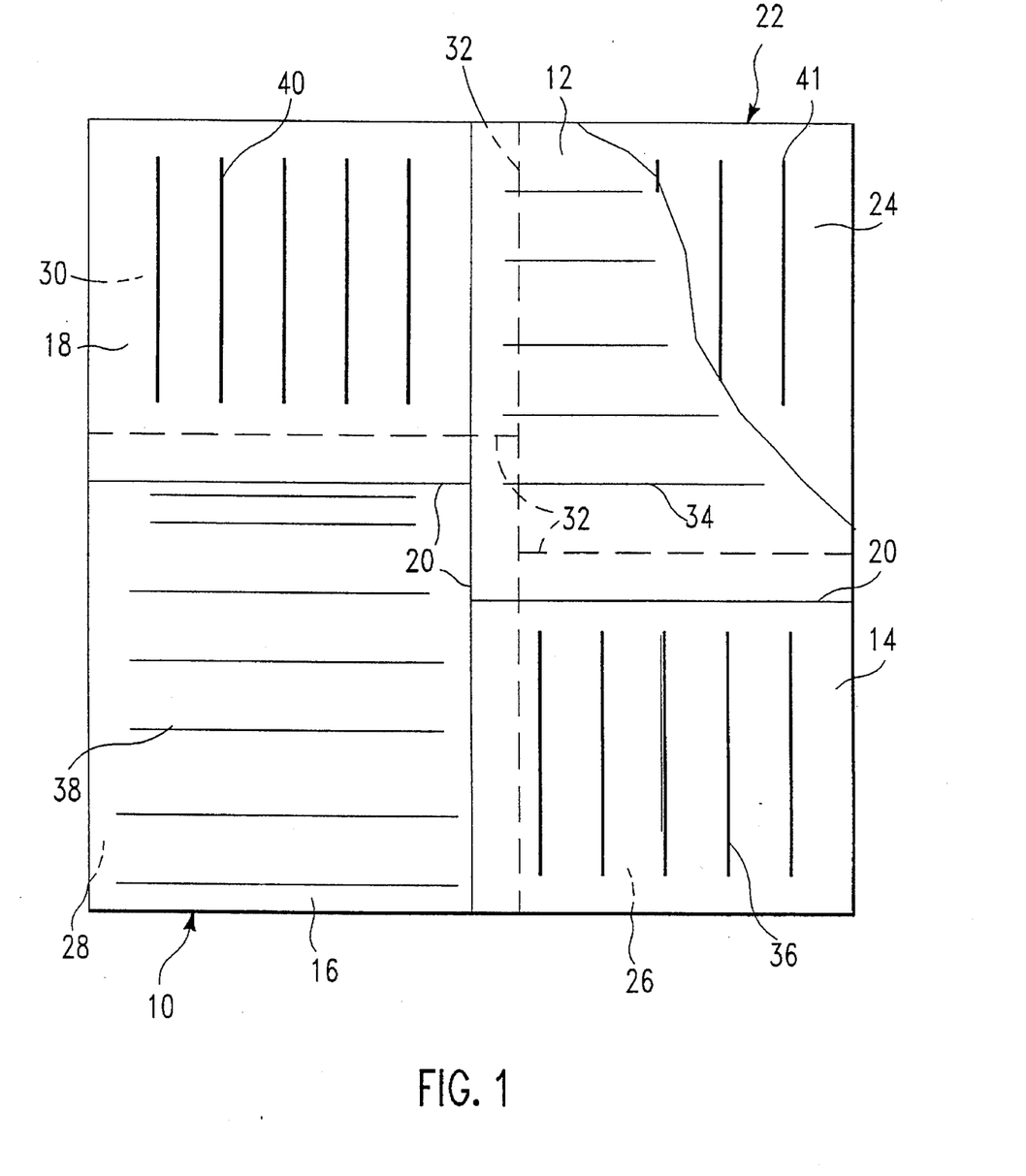
FIG. 1 is a plan view of a large ceramic greensheet with a second large ceramic greensheet underneath it.

Referring to the drawings in more detail and particularly referring to FIG. 1, there is shown a large ceramic greensheet article generally indicated by 10. This large ceramic greensheet article has particular utility for electronic applications such as electronic substrates for connecting semiconductor devices, etc. The large ceramic greensheet 10 comprises a plurality of greensheet segments 12, 14, 16 and 18, which are joined edge to edge 20 to form the large greensheet. As can be seen from FIG. 1, the greensheet segments are of different sizes and there are four of such greensheet segments. As will be appreciated hereafter, the greensheet segments may be of equal or different size and there may be more or less than four of such greensheet segments. The number and shape of the greensheet segments shown in FIG. 1 are for illustration purposes only.

The ceramic particles that comprise the greensheet segments may be chosen from those ceramic materials that are typically utilized for electronic applications. For purposes of illustration and not limitation, these ceramic materials may include alumina, alumina plus glass, aluminum nitride, silicon nitride, mullite, glasses (e.g., borosilicate glasses) and glass ceramic materials (e.g., such as those disclosed in Kumar et al., U.S. Pat. No. 4,413,061). Some preferred glass ceramic compositions are disclosed in Table I.

It is anticipated that a single large greensheet may be sold as a separate article of commerce. Normally, however, there will be a plurality of such larger greensheets. Now as shown in FIG. 1, there are two large ceramic greensheets. On the top, there is a large ceramic greensheet consisting of segments 12, 14, 16 and 18 which are abutted along edges 20. Greensheet segment 12 has been partially removed to show a second large green ceramic greensheet 22 which consists of segments 24, 26, 28 and 30 that are abutted along edges 32 shown in phantom.

It is of upmost importance to the present invention that the edges of adjoining greensheet segments on one layer do not overlay the edges of adjoining greensheets on the layer above or below. An exception to this will be discussed hereafter. The reason for this important limitation is that the edges of joined greensheet segments can present lines of weakness, so for the integrity of the finished greensheet article it is necessary that these lines of weakness be staggered from sheet to sheet.

It is preferred that there be a metal wiring pattern on at least one of the greensheet segments.

TABLE I

| GLASS CERAMIC COMPOSITIONS (WEIGHT PERCENT) | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $SiO_2$ | 55.0 | 54.5 | 54.5 | 52.3 | 57.8 | 60.0 | 50.0 | 53.9 | 54.0 | 55.0 | 60.0 | 54.5 |
| $Al_2O_3$ | 21.1 | 21.0 | 21.0 | 19.7 | 22.2 | 18.2 | 22.9 | 20.7 | 21.0 | 21.0 | 17.0 | 20.0 |
| MgO | 22.3 | 19.8 | 19.8 | 24.0 | 16.0 | 17.8 | 22.2 | 19.6 | 19.0 | 18.0 | 18.0 | 20.0 |
| $B_2O_3$ | 1.3 | 1.0 | 1.0 | 1.0 | 1.0 | 1.0 | 1.1 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 |
| $CeO_2$ | | 1.0 | | | | | | | | | | |
| MnO | | | 1.0 | | | | | | | | | |
| $ZrO_2$ | | | | | | | | 2.0 | | | | 2.0 |
| CaO | | | | | | | | | 2.0 | | | 1.0 |
| NiO | | | | | | | | | | 2.0 | | |
| $Li_2O$ | | | | | | | | | | | 1.0 | |
| $Fe_2O_3$ | | | | | | | | | | | | |
| $Na_2O$ | | | | | | | | | | | | |
| $TiO_2$ | | | | | | | | | | | | |
| ZnO | | | | | | | | | | | | |
| CuO | | | | | | | | | | | | |

TABLE I-continued

| GLASS CERAMIC COMPOSITIONS (WEIGHT PERCENT)) | | | | | | | | |
|---|---|---|---|---|---|---|---|---|
| | 13 | 14 | 15 | 16 | 17 | 18 | 19 | 20 |
| $SiO_2$ | 57.0 | 55.0 | 47.0 | 53.9 | 54.0 | 54.5 | 54.0 | 54.0 |
| $Al_2O_3$ | 21.0 | 21.0 | 33.5 | 20.8 | 22.0 | 21.3 | 22.0 | 21.0 |
| MgO | 20.0 | 22.0 | 13.5 | 19.6 | 20.0 | 19.9 | 20.0 | 22.0 |
| $B_2O_3$ | 1.0 | 2.0 | 3.0 | 1.0 | 1.0 | 1.0 | 1.0 | 1.0 |
| $P_2O_5$ | 1.0 | | 3.0 | 2.7 | 2.0 | 2.8 | 2.0 | |
| $CeO_2$ | | | | | | | | |
| MnO | | | | | | | | |
| $ZrO_2$ | | | | | | | | |
| CaO | | | | | | | | |
| NiO | | | | | | | | |
| $Li_2O$ | | | | | | | | |
| $Fe_2O_3$ | | | 2.0 | | | | | |
| $Na_2O$ | | | | | 1.0 | | | |
| $TiO_2$ | | | | | | 1.0 | | |
| ZnO | | | | | | | 1.0 | |
| CuO | | | | | | | | 2.0 |

Thus, as shown in FIG. 1, there is wiring pattern 34 on the greensheet segment 12. Also shown therein are wiring patterns 36, 38 and 40. The choice of wiring patterns are up to the individual designer of the substrate article. However, in one embodiment of the invention, it is preferred that the metal patterns on adjacent greensheet segments comprise wiring of opposed or orthogonal directions. Thus, wiring pattern 34 on greensheet 12 is in the X direction while wiring pattern 36 on greensheet segment 14 is in the Y direction. Similarly, wiring patterns 38, 40 on greensheet segments 16, 18, respectively, have also been laid out in opposed orthogonal directions. Further, wiring pattern 41 on greensheet segment 24 on the layer below is in the Y direction as compared to the X wiring pattern on greensheet segment 12. The reason that it is preferred to have the wiring patterns arranged in such a manner is that it allows one to go from the X wiring pattern to the Y wiring pattern and vice versa on a single layer of greensheet. Of course, the wiring pattern could be diagonal or some other pattern to achieve the same or similar results.

When laying out the wiring patterns on the greensheets it has been found preferable by the present inventors to have the wiring patterns distributed symmetrically over the larger greensheets on each particular layer. That is the wiring pattern on each large greensheet should take up approximately the same area. When this is done from layer to layer, then the greensheets may be free sintered. In this way distortion of the greensheets during sintering may be avoided.

As further shown in FIG. 1, the wiring patterns are, for example, X and Y signal wiring lines. It is also contemplated within the scope of the invention that the wiring patterns may be redistribution patterns, ground planes, and other wiring patterns usable in the construction of electronic substrates.

Figure 2A:
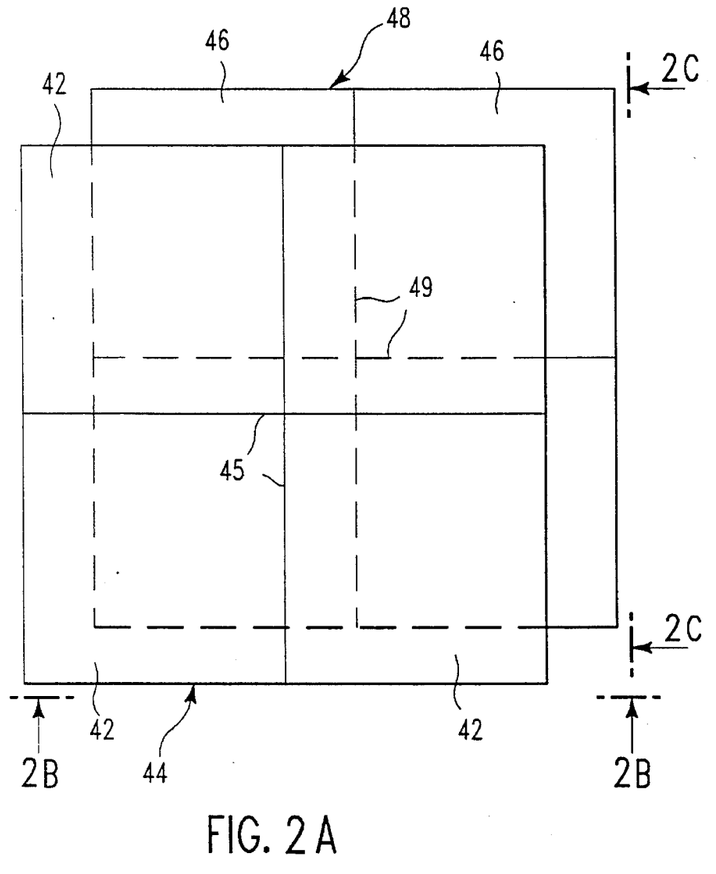
Figure 2B:
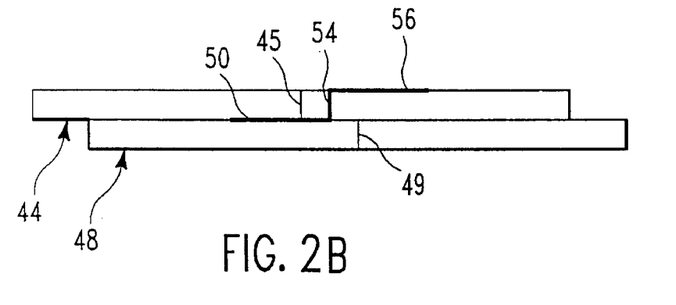
FIGS. 2B and 2C are end views of FIG. 2A in the direction of arrows 2B and 2C, respectively.

Referring now to FIG. 2A, there is another embodiment of the large ceramic greensheet article according to the present invention. In FIG. 2A, greensheet segments 42 are all of equal size in large ceramic greensheet layer 44. Similarly, greensheet segments 46 of large ceramic greensheet layer 48 are also of equal size. However, to avoid the edges 45 of the greensheet segments of layer 44 overlaying the joined edges 49 of the greensheet segments in layer 48, the joined segments of each larger greensheet are staggered from layer to layer as shown in FIG. 2A. After the desired number of greensheet layers are formed then the stack of joined segments may be sized by means already known in the art. Of course, care should be taken that electrical connections or wiring patterns are not damaged during the sizing operation. FIG. 2B shows the stacked large ceramic greensheets 44, 48 of FIG. 2A from the side.

As was discussed with respect to FIG. 1, the greensheet segments may contain wiring patterns. The wiring patterns may be, for example, X and Y signal wiring lines, redistribution patterns, ground planes, etc. If large ceramic greensheet layers 44, 48 contain X and Y signal wiring patterns, it may be desirable to have, for example, a reference plane in a third large ceramic greensheet layer (not shown). The number of layers and the particular wiring scheme are well within the skill of the individual designer of the substrate article.

Also shown in FIG. 2B is another aspect of the invention, namely the method of making electrical connections from or across the joined edges of greensheet segments. It is readily apparent that electrical connections cannot directly cross the joined edges of greensheet segments because of the gap that initially existed between adjacent greensheet segments. Thus, as shown in FIG. 2B, if one wanted to go from greensheet layer 48 to greensheet layer 44 and past edges or joints 45, 49, one could start, for example, from wiring line 50 which crosses underneath edge 45 in layer 44. Wiring line 50 in layer 48 aligns with via 54 in layer 44 which then makes connection with line 56 which passes above joined edges 49.

Figure 2C:
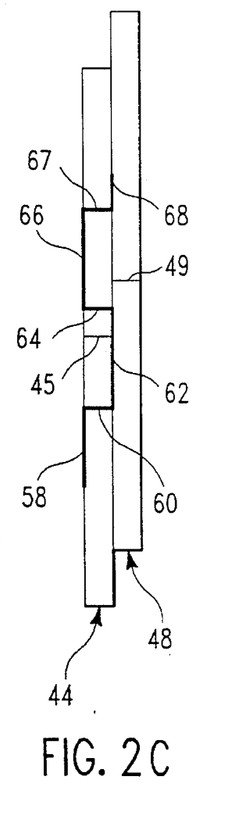

In FIG. 2C is another side view of the stack of layers 44 and 48 of FIG. 2A. FIG. 2C illustrates another way the connections may be made across the edges of joined greensheets. If it was desired to go across segments in layer 44, normally a line could not be joined across the edge because the line would be distorted during sintering. A connection across edge 45 between lines 58, 66 may thus be made in the following manner: Line 58 would run into via 60 which then would make connection with line 62 in layer 48. Line 62 runs underneath joined edges 45 but not past joined edges 49. Then, line 62 aligns with via 64 so that the connection with line 62 may be made through via 64 up through layer 44 and then to line 66. Accordingly, a connection from line 58 to 66 across joined edge 45 has been made. If it was desired instead to continue the traverse and make connection with another greensheet segment in layer 48, then connections would be made between line 66 and line 68 through via 67.

In this way, electrical connections may be made between adjacent greensheet segments, or greensheet segments on different layers, without actually crossing the joint formed between adjacent greensheet segments. In essence, a wiring feature, such as a wiring line, traverses the joint but is on a different greensheet layer (either above it or below it) than the greensheet layer containing the joint.

The present invention also includes the large ceramic greensheet as described earlier which is then sintered to form a large ceramic substrate. In simple terms, the large ceramic substrate is formed by joining a plurality of greensheet segments edge to edge to form a larger greensheet and then sintering the larger greensheet to form a large substrate. Once the larger greensheets are formed, if it is desirable to have a multilayer substrate, a plurality of such larger greensheets are formed and then stacked and laminated to form a greensheet laminate which is then sintered. As mentioned previously, if the wiring pattern on the large greensheets is symmetrically distributed then the greensheet laminate may be free sintered.

A key part of the present invention is how to join the greensheet segments so that they form a coherent integral larger substrate. It is expected that one way to join the greensheet segments would be to apply heat and pressure to the greensheets, either during lamination or during sintering, to cause flow of the greensheet material adjacent the edges. As the greensheet material comprises a thermoplastic binder, the binder may be appropriately selected so as to flow upon the application of heat and pressure to join the two greensheets together. Then, during sintering the ceramic particles would interdiffuse from greensheet to greensheet to form the larger greensheet.

Figure 3:
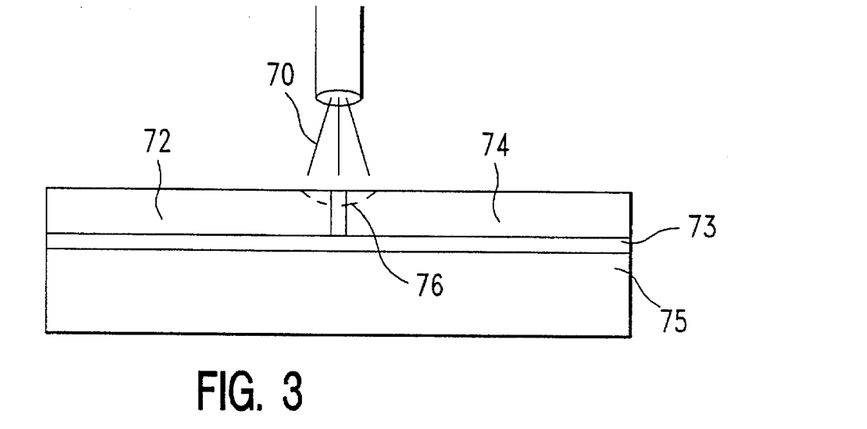
FIGS. 3, 4 and 5 are side views of alternative arrangements for joining adjacent greensheet segments.

It is more preferred, however, that an ingredient be applied to the edges of adjacent greensheet segments to encourage bonding between these adjacent edges of the greensheet segments. One such embodiment of this invention is shown in FIG. 3 where there is shown the application of a solvent 70 to the greensheet segments 72 and 74 which are sitting on Mylar release layer 73 and fixture 75. As can be seen, the respective edges (more accurately, the binder comprising the edges) of the greensheet segments are dissolved as shown by lines 76 in phantom. The edges of the greensheet segments thus dissolve and float together to join the greensheet segments together.

Figure 4:
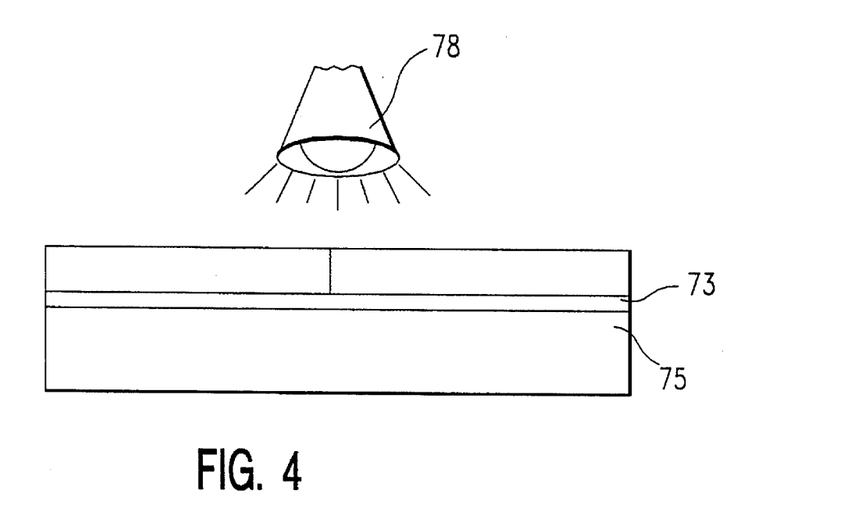

Referring now to FIG. 4, the edges of the greensheet segments have been caused to be bonded together or joined by the application of a local heat source 78 which causes the flow of greensheet binder material to form a bond. This local heating may be done by, for example, a laser.

Figure 5:
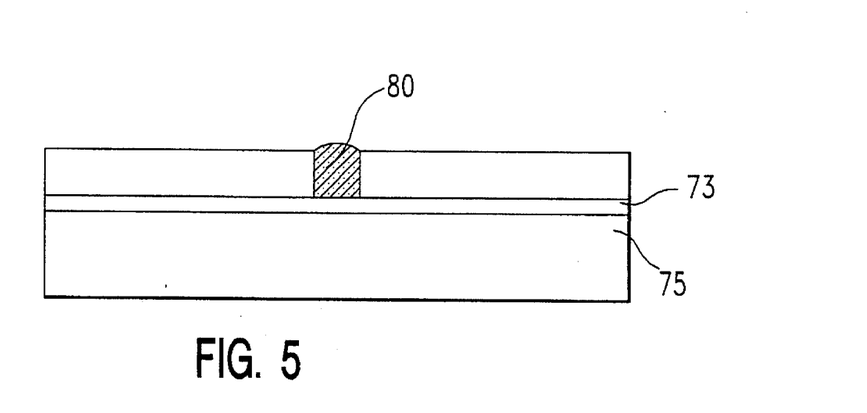

In another preferred embodiment as shown in FIG. 5, the ingredient that causes bonding of the greensheets may be, for example, a metal or ceramic paste 80. Alternatively, the ingredient may be a ceramic slurry. The difference between a paste and a slurry is that the paste is more viscous and thus does not need to be confined as much during application. The metal-containing paste, if desired, may also contain ceramic or glass particles to encourage the bonding between the joined greensheet segments.

Other ingredients may include a photosensitive organometallic compound which is added (e.g., in a paste) to the area between the greensheet segments to be joined. This photosensitive organometallic compound is exposed to a light source, such as a laser, to convert the organometallic compound to a metal. Another ingredient may be one that upon reaching a sintering temperature, the greensheet material at the edges will undergo liquid phase sintering. In this case, the ingredient may be added in the space between the two greensheets (e.g., in a paste) or may actually comprise the edges of the greensheet segments that are to be joined.

Another alternative ingredient for joining the edges of adjacent greensheet segments is an ingredient that does not strongly react with the adjacent greensheet material. The reason that such a non-reactive material would be desirable is that it is considered important that no material in the greensheet segment be physically transported into the gap between the segments as any transport of material from the greensheet segment to the gap will result in a lower density area in the sheet, and thus a defect in the fired substrate. Accordingly, in this aspect of the invention, it is preferred that the ingredient comprise an aqueous based latex emulsion. This latex emulsion does not react with the binder of the greensheet segment which is typically a non-aqueous based polymeric binder material such as polyvinyl butyral. It is further preferred that the ingredient, in addition to containing the aqueous based latex emulsion, further comprise a ceramic powder which is similar to the ceramic powder that makes up the bulk greensheet segment material.

Figure 9:
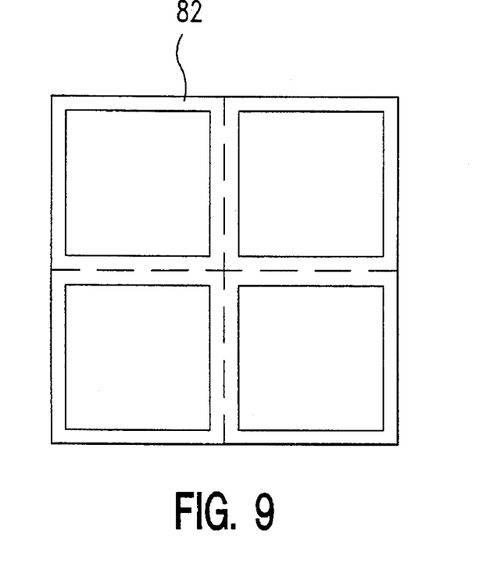
FIG. 9 is a plan view illustrating a window compensator for joining together greensheet segments.

Referring now to FIG. 9, the step of joining the greensheet segments may comprise, instead of applying an ingredient between the edges, applying a layer of greensheet 82 in the shape of a window frame over the greensheet segments to be joined. The window frame may be placed over the greensheet segments and temporarily adhered to the greensheet segments so that the green laminate may be handled. Or, the greensheet segments may be stacked with the window frame on alternate layers to hold the greensheet segments in place. Upon sintering, the window frame layer 82 would hold the greensheet segments together.

Figure 10:
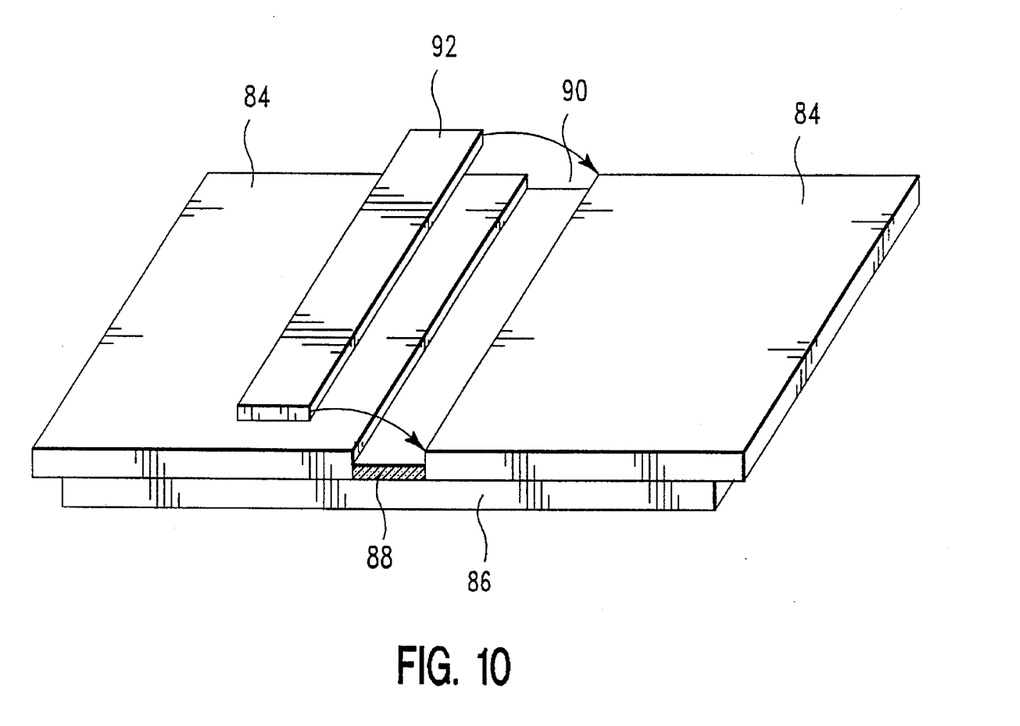
FIG. 10 is a perspective view illustrating a further alternative method of joining together greensheet segments.

Referring now to FIG. 10 a further alternative method of joining the greensheet segments is shown. As shown therein, greensheet segments 84 are desired to be joined together. The greensheet segments 84 can be placed upon another greensheet segment 86. Thereafter, a slurry 88 is sprayed within the gap 90 but only to partially fill the gap. Then, a piece of greensheet tape 92 is laid within the gap to completely fill it. The composition of the tape is preferably similar to the composition of the greensheet segments 84 and 86. Upon sintering, the combination of the tape 92 and slurry 88 would cause greensheet segments 84 and 86 to be joined together.

Figure 6A:
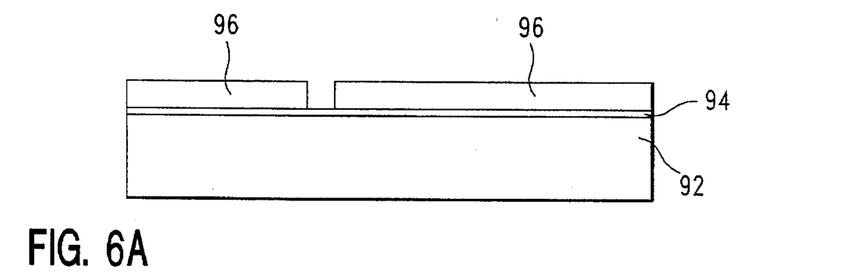
FIGS. 6A–6D are side views illustrating a preferred method of joining and stacking greensheet segments.

A preferred method of assembling the greensheet laminate according to the invention is illustrated in FIGS. 6A–6D. Referring first to FIG. 6A, greensheet segments 96 are placed upon fixture 92. It has been found preferable to place a sheet of Mylar 94 on top of the fixture before placing the greensheet segments 96. It has also been found preferable to not add any ingredient to join the greensheet segments together at this point in the process.

Figure 6B:
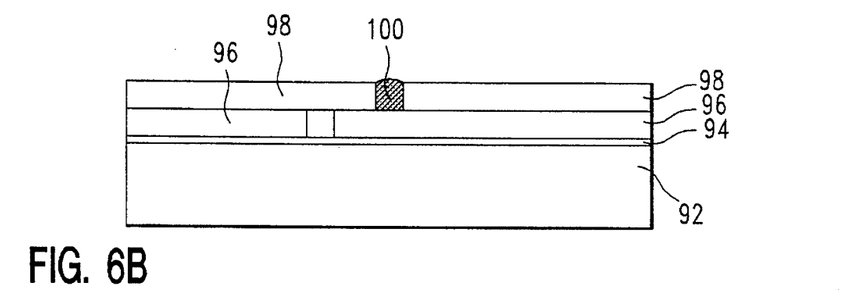

Referring now to FIG. 6B, a second layer of greensheet segments 98 are placed upon greensheet segments 96. It is noted that the gap between greensheet segments is staggered between the first layer and second layer. That is, the gap between greensheet segments 96 is offset from the gap between greensheet segments 98. In the gap between greensheet segments 98 is placed an ingredient 100 to bond the greensheet segments together. For purposes of illustration and not limitation, the ingredient 100 shown in FIG. 6B is a ceramic paste.

Figure 6C:
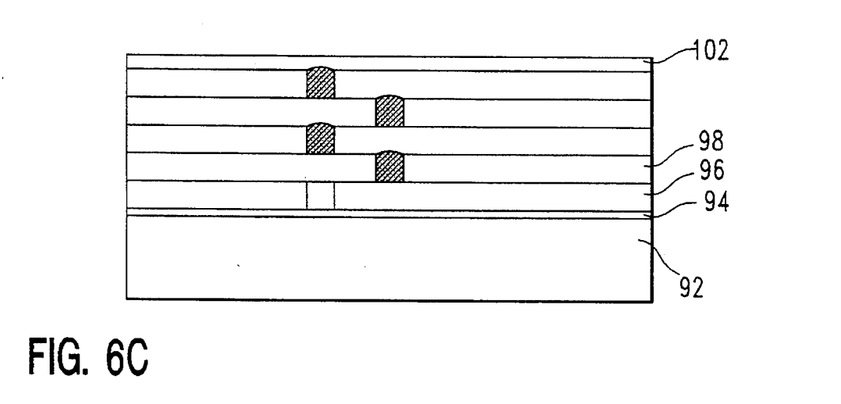

As shown in FIG. 6C, additional layers are built upon the first two layers of greensheet segments and the gaps between adjacent greensheet segments in each of the layers are filled with a ceramic paste. There are a total of five such layers shown in FIG. 6C. In practice, however, there may be more or less than the five layers shown. On top of the layers of the greensheet segments joined by the ceramic paste is placed another sheet of Mylar 102. This second Mylar sheet 102 has been found useful when filling the gap between the first layer of greensheet segments 96.

Figure 6D:
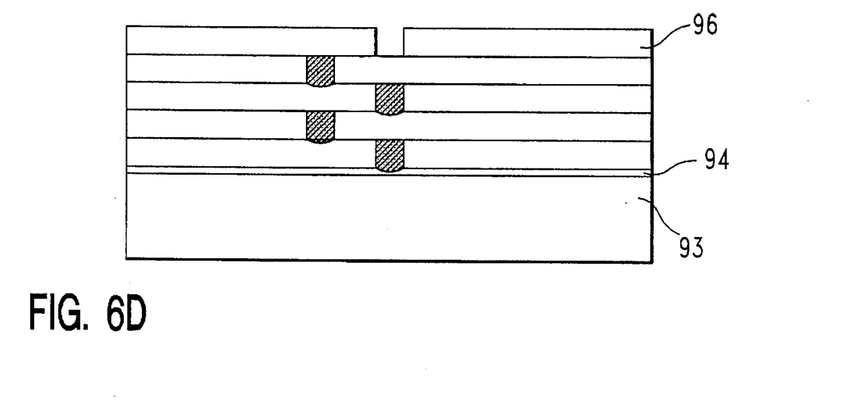

The greensheet laminate shown in FIG. 6C may now be removed and flipped over, as shown in FIG. 6D, so that mylar sheet 102 is now in contact with fixture 93. Mylar sheet 94 has now been removed and discarded. The gap between greensheet segments 96 may now be filled with a ceramic paste. Thereafter, the greensheet laminate shown in FIG. 6D may be removed from fixture 93 and placed in another fixture (not shown) for lamination. Mylar release sheet 102 would be discarded prior to lamination. After lamination the greensheet laminate may be sintered if desired.

Figure 7:
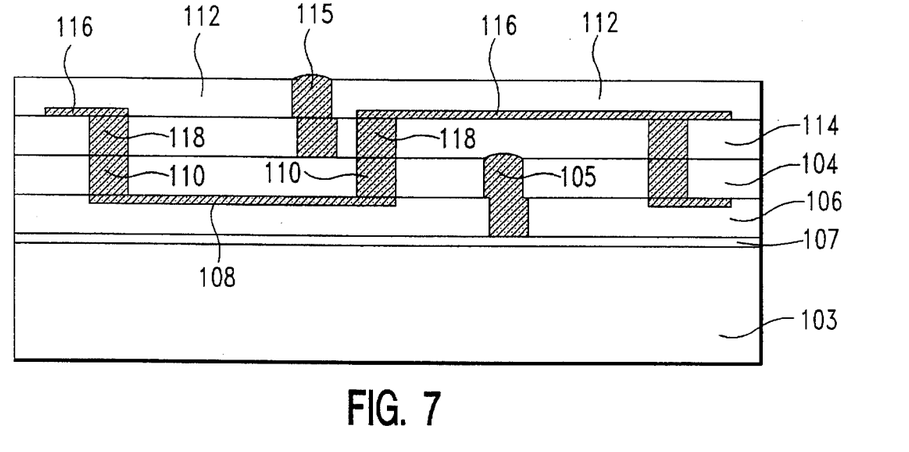
FIG. 7 is a side view of an alternative arrangement for joining and stacking greensheet segments.

FIG. 7 shows an alternative embodiment for stacking the greensheet segments. In this particular embodiment the greensheet segments will be stacked two layers at a time. This particular stacking arrangement has been found particularly advantageous when using a metallic paste to join the greensheet segments. Metallic wiring lines 108 are screened on greensheet segments 106. On top of greensheet segments 106 are placed greensheet segments 104. Vias 110 in greensheet segments 104 make contact with wiring lines 108. The greensheet segments 104 and 106 and release layer 107 are then placed in a stacking fixture 103 such as that shown in FIG. 6 and a metallic paste 105 is screened in the gap between greensheet segments 104 and 106. The paste is then allowed to dry. On top of greensheet segments 104 are placed greensheet segments 114 which have metallic vias 118 formed therein and wiring lines 116 formed on the surface. Then, on top of greensheet segments 114 are placed greensheet segments 112. In the gap between greensheet segments 112 and 114 a metallic paste 115 is placed to fill the gap. It is to be noted that the gap between greensheet segments 112 and 114 is offset from the gap between greensheet segments 104, 106. Additionally, vias 118 from greensheet segments 114 are in alignment with vias 110 in greensheet segments 104. It should also be noted that wiring lines 116 and 108 are insulated from the gap between the greensheet segments by an overlaying greensheet segment. It is necessary to have an insulating layer of greensheet segment between the wiring line and the gap because a metallic paste is used to fill the gap. Otherwise a short would be created. Groups of two or more greensheet segments may be joined in the manner shown in FIG. 7.

Figure 8A:
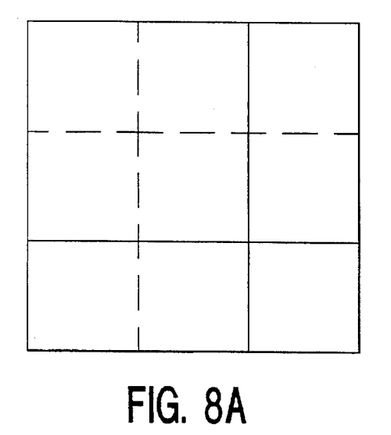
FIGS. 8A, 8B and 8C are plan views illustrating alternative arrangements for piecing together greensheet segments.
Figure 8B:
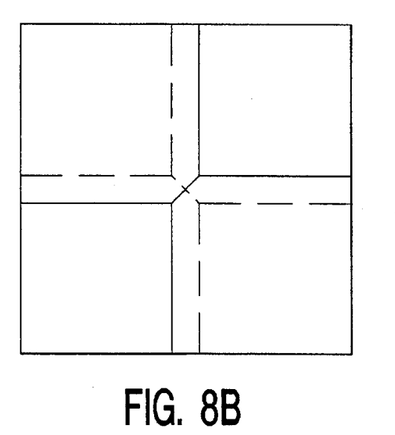
Figure 8C:
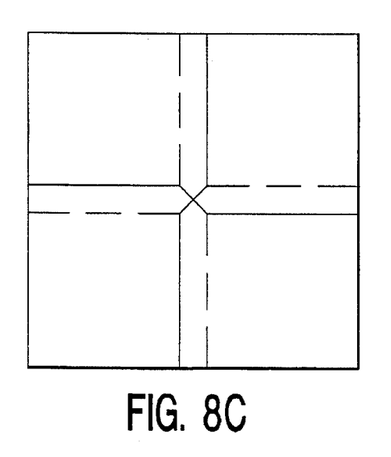

Finally as shown in FIGS. 8A, 8B and 8C are alternative arrangements for piecing together the greensheet segments. As can be seen, the joint between the top layer of greensheet segments is staggered from the joint between the greensheet segments on the layers below it. The joints should also be staggered from the greensheet segments above the ones shown in FIGS. 8A, 8B and 8C. The embodiment shown in FIG. 8C is particularly advantageous in that only 1 size greensheet segment need be utilized. As can be seen, each greensheet segment has a tab and each greensheet segment is rotated 90° with respect to its adjacent greensheet segment so that the pointed edges of the tabs meet in the center.

Other advantages of the invention will become more apparent after referring to the following Examples.

EXAMPLES

Example I

Glass ceramic greensheet segments were prepared in the conventional way by tape casting as discussed previously. The greensheets comprised cordierite-forming glass particles, polyvinyl butyral binder plus other conventional organic constituents. The composition of the cordierite-forming glass (the glass crystallizes to form cordierite upon sintering), in weight percent, was as follows:

| | |
|---|---|
| $SiO_2$ | 55.0 |
| $Al_2O_3$ | 21.1 |
| MgO | 22.3 |
| $B_2O_3$ | 1.3 |
| $P_2O_5$ | 0.3 |

The size of the greensheets was 185 mm×185 mm.

Each of the greensheets also had wiring patterns which were made by screening copper paste onto the green sheets. The copper paste consisted of copper particles, ethyl cellulose binder and conventional organic additives.

The greensheets were joined in the following manner. A sheet of Mylar material was placed on a stacking fixture. Thereafter, 4 greensheet segments were placed on the Mylar. The greensheets were carefully placed so that a gap of no more than 3 mm remained. Then, the next layer of greensheets was placed on the first layer of greensheets. Again, the greensheets were spaced so as to leave a gap of no more than 3 mm. The second layer of greensheets were placed so that the gaps of each layer were offset from one another as shown in FIG. 6B.

Into the gaps of the second layer was screened a paste consisting of cordierite-forming glass particles of the same composition as the glass in the greensheet. The paste composition consisted of, in weight percent, 62% cordierite, 15% Rhoplex B60A binder, 1% Benzoflex binder, 3% water, 16% organic solvents, 2% B90 Butvat (polyvinyl butyral) binder, remainder minor constituents. The paste was then allowed to dry.

The stacking continued in this manner until 60 layers were built.

The greensheet laminate was sintered according to the following firing schedule. The temperature was ramped up in wet nitrogen to 705°–725° C., then the atmosphere was switched to wet hydrogen to perform binder burnoff. After switching to forming gas, the temperature was ramped up to 975° C. for densification and crystallization. While still in forming gas, the temperature was ramped down to room temperature. All ramp rates were kept below 1° C./min. to avoid thermally stressing the substrate.

The finished substrate had a final size of 320 mm×320 mm.

The large substrates were tested under 4-point mechanical testing and the strength was found to be equivalent to the bulk ceramic.

Example II

Alumina ceramic greensheet segments were prepared by conventional tape casting. The greensheets comprised alumina ($Al_2O_3$) particles, glass frit, polyvinyl butyral binder plus other conventional organic constituents. The proportion of the alumina and glass was 89 weight percent $Al_2O_3$ and 11 weight percent glass frit, based on the solids content of the greensheet. The composition of the glass frit, in weight percent, was: 52% $SiO_2$, 30% $Al_2O_3$, 8.5% CaO and 8.5% MgO. The size of the greensheets was 185 mm×185 mm.

Each of the greensheets also had wiring patterns which were made by screening molybdenum paste onto the green sheets. The molybdenum paste consisted of molybdenum particles, ethyl cellulose binder and conventional organic additives.

The greensheets were stacked as in Example I with the following exceptions. There should be no gap between greensheet segments so that the greensheet segments would abut the adjacent segments. Additionally, no joining paste was placed between adjacent greensheet segments. The resultant substrate size after sizing was 320 mm×320 mm.

The greensheet laminate was free sintered according to the following firing schedule. The temperature was ramped up at less than 1° C./min. to 600° C. in an atmosphere of hydrogen. The atmosphere was switched to wet hydrogen and the temperature was ramped up to 980° C. at 2° C./min. for a 3 hour hold to accomplish binder pyrolysis. Then, the temperature was ramped up at about 8° C./min. to 1050° C. and held there for 3 hours to accomplish binder burnoff. Then, the temperature was ramped up at about 1° C./min. to 1555° C. for densification. After 3 hours at this temperature, the temperature was ramped down at 2° C./min. to 800° C., at which time the atmosphere was switched to nitrogen and the temperature was allowed to freefall to room temperature.

A characteristic of the substrate composition in this example is that the glass frit encourages the liquid phase sintering of the substrate. In a similar manner, the greensheet segments are joined by this same liquid phase sintering phenomena. Thus, no paste is needed to join the greensheet segments.

The finished substrate had a final size of 260 mm×260 mm.

Upon sectioning, the integrity of the sintered substrate appeared to be good with no density gradient between greensheet segments.

Example III

Glass ceramic greensheet segments were prepared as in Example I except that full size substrates were not prepared. Samples were prepared to test the joining of greensheet segments with a metal-containing paste. In this Example, none of the greensheet segments had wiring patterns screened on them.

The greensheet segments were placed 2 layers at a time, as shown in FIG. 7, with a gap of about 1 mm. Into the gap was placed a paste consisting of copper particles, cordierite ceramic particles, ethyl cellulose binder and conventional organic additives. Of the copper and cordierite-forming glass particles, the copper comprised 40 volume percent and the cordierite was 60 volume percent. The composition of the cordierite-forming glass, in weight percent, in the paste was as follows:

| | |
|---|---|
| $SiO_2$ | 55.0 |
| $Al_2O_3$ | 21.23 |
| MgO | 20.0 |
| $B_2O_3$ | 1.0 |
| $P_2O_5$ | 2.77 |

The greensheet laminate was then sintered as in Example I.

The integrity of the sintered substrate appeared to be good. After sectioning the substrate at the joined segments, a good bond between the ceramic and paste was observed.

Example IV

A substrate laminate was prepared in a manner identical to that in Example III except that the paste that joined the greensheet segments consisted of copper particles, ethyl cellulose binder and organics.

The greensheet laminate was then sintered as in Example I.

The integrity of the sintered substrate appeared to be good. After sectioning the substrate at the joined segments, a generally good bond between the ceramic and paste was observed, although there was some delamination between the paste and ceramic. The delamination between the paste and the ceramic did not, however, cause the propagation of a crack into the bulk ceramic.

Example V

A substrate laminate was prepared in a manner identical to that in Example I except that the paste that joined the greensheet segments consisted of, in weight percent, 66% cordierite-forming glass particles, 26% Rhoplex B60A (a latex emulsion binder), 6.0% deionized water and 2% other minor additives. The composition of the cordierite-forming glass particles was the same as the bulk ceramic.

The greensheet laminate was then sintered as in Example I.

The finished substrate had a final size of 320 mm×320 mm.

The integrity of the sintered substrate appeared to be good. After sectioning the substrate at the joined segments, a generally good bond between the ceramic and paste was observed.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A large ceramic greensheet article comprising a plurality of greensheet segments joined, edge to edge, to form a larger greensheet and further comprising a metal pattern applied on a plurality of said greensheet segments wherein the metal patterns on adjacent greensheet segments comprise wiring of opposed orthogonal directions.

2. A large ceramic substrate article comprising at least one layer of sintered ceramic material, said layer comprising a plurality of segments of ceramic material joined edge to edge and further comprising a metal pattern applied on a plurality of said segments wherein the metal patterns on adjacent segments comprise wiring of opposed orthogonal directions.

3. The article of claim 2 wherein there are a plurality of layers in said substrate.

4. The article of claim 3 further comprising a metal pattern applied over a plurality of said layers, wherein said metal patterns are symmetrically applied from layer to layer.

5. The article of claim 1 further comprising an ingredient at adjacent edges that will encourage bonding between said adjacent edges.

6. The article of claim 2 further comprising an ingredient at adjacent edges that bonds said adjacent edges.

7. The article of claim 6 wherein said ingredient consists of a metal, ceramic or mixture thereof.

8. The article of claim 6 wherein said ingredient is selected so that said substrate, at the edges at least, has undergone liquid phase sintering.

9. The article of claim 3 wherein said layers are grouped into groups of 2 layers each, each 2 layer group forming a repeatable unit.

10. The article of claim 9 further comprising a metal pattern applied on at least one of the layers in each unit.

11. The article of claim 1 wherein a plurality of said larger greensheets are formed, and wherein said larger greensheets are stacked so that the joint between greensheet segments is shifted with respect to the joint between greensheet segments in the larger greensheet above it or below it.

12. The article of claim 3 wherein said layers are stacked so that the joint between segments is shifted with respect to the joint between segments in the layer above it or below it.

13. The article of claims 1 or 2 wherein said greensheet segments are of unequal size.

14. The article of claims 1 or 2 wherein said greensheet segments are of equal size.

15. The article of claim 11 further comprising a plurality of metal wiring patterns on a plurality of said greensheet segments with at least two of said metal wiring patterns being connected, wherein said metal wiring patterns are on different greensheet segments.

16. The article of claim 15 wherein said different greensheet segments are adjacent to each other.

17. The article of claim 12 further comprising a plurality of metal wiring patterns on a plurality of said segments with at least two of said metal wiring patterns being connected, wherein said metal wiring patterns are on different segments.

18. A large ceramic greensheet article comprising a plurality of greensheet segments joined, edge to edge, to form a larger greensheet; a plurality of said larger greensheets formed and stacked so that the joint between greensheet segments is shifted with respect to the joint between greensheet segments in the larger greensheet above it or below it; a plurality of metal wiring patterns on a plurality of said greensheet segments with at least two of said metal wiring patterns being connected, wherein said metal wiring patterns are on different greensheet segments; and a wiring feature traversing the joint between adjacent greensheet segments but on a layer different from that of said adjacent greensheet segments, wherein said wiring feature connects said two connected metal wiring patterns.

19. A large ceramic substrate article comprising a plurality of layers of sintered ceramic material, each of said layers comprising a plurality of segments of ceramic material joined edge to edge, wherein said layers are stacked so that the joint between segments is shifted with respect to the joint between segments in the layer above it or below it; a plurality of metal wiring patterns on a plurality of said segments with at least two of said metal wiring patterns being connected, wherein said metal wiring patterns are on different segments; and a wiring feature traversing the joint between adjacent segments but on a layer different from that of said adjacent segments, wherein said wiring feature connects said two connected metal wiring patterns.

* * * * *